US010658972B2

(12) United States Patent
Oya et al.

(10) Patent No.: US 10,658,972 B2
(45) Date of Patent: May 19, 2020

(54) PIEZOELECTRIC OSCILLATOR AND PIEZOELECTRIC OSCILLATION DEVICE

(71) Applicant: Murata Manufacturing Co., Ltd., Nagaokakyo-shi, Kyoto-fu (JP)

(72) Inventors: Tomohiro Oya, Nagaokakyo (JP); Hiroaki Kaida, Nagaokakyo (JP); Yoshihiro Ikeda, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 50 days.

(21) Appl. No.: 16/008,388

(22) Filed: Jun. 14, 2018

(65) Prior Publication Data

US 2018/0302032 A1    Oct. 18, 2018

Related U.S. Application Data

(63) Continuation of application No. PCT/JP2016/087744, filed on Dec. 19, 2016.

(30) Foreign Application Priority Data

Dec. 25, 2015  (JP) .................................. 2015-254874

(51) Int. Cl.
*H03B 5/04* (2006.01)
*H01L 23/02* (2006.01)
(Continued)

(52) U.S. Cl.
CPC ............... *H03B 5/04* (2013.01); *H01L 23/02* (2013.01); *H01L 23/552* (2013.01); *H01L 25/16* (2013.01); *H01L 41/0533* (2013.01); *H03B 5/36* (2013.01); *H03H 9/02023* (2013.01); *H03H 9/02086* (2013.01); *H03H 9/02102* (2013.01); *H03H 9/02133* (2013.01); *H03H 9/0509* (2013.01);
(Continued)

(58) Field of Classification Search
CPC .... H03B 5/04; H03B 5/36; H03B 2200/0018; H03H 9/02023; H03H 9/02102; H03H 9/02133; H03H 9/02086; H03H 9/1021; H03H 9/215; H03H 9/0509; H03H 9/0542; H03H 9/0552; H03H 9/19; H01L 23/02; H01L 23/552; H01L 25/16; H01L 41/0533
USPC ........... 331/176, 158, 68; 310/370; 29/25.42
See application file for complete search history.

(56) References Cited

U.S. PATENT DOCUMENTS

2011/0221537 A1* 9/2011 Aratake ................... H03H 3/04
                                                        331/158
2017/0019109 A1* 1/2017 Arai ........................ H03L 1/028

FOREIGN PATENT DOCUMENTS

JP      S5683048 A      7/1981
JP      2000295066 A    10/2000
(Continued)

OTHER PUBLICATIONS

International Search Report issued for PCT/JP2016/087744, dated Feb. 28, 2017.
(Continued)

*Primary Examiner* — Arnold M Kinkead
(74) *Attorney, Agent, or Firm* — Arent Fox LLP

(57) ABSTRACT

A piezoelectric oscillator includes a base member on which a piezoelectric resonator is mounted, a first lid member that seals the piezoelectric resonator on the base member, and a second lid member that seals the first lid member on the base member. The first lid member and the second lid member are each joined to the base member.

19 Claims, 5 Drawing Sheets

(51) Int. Cl.
H01L 23/552 (2006.01)
H01L 25/16 (2006.01)
H01L 41/053 (2006.01)
H03B 5/36 (2006.01)
H03H 9/02 (2006.01)
H03H 9/05 (2006.01)
H03H 9/10 (2006.01)
H03H 9/19 (2006.01)
H01L 41/04 (2006.01)
H01L 41/047 (2006.01)

(52) U.S. Cl.
CPC ........ *H03H 9/0542* (2013.01); *H03H 9/0552* (2013.01); *H03H 9/1021* (2013.01); *H03H 9/19* (2013.01); *H01L 25/165* (2013.01); *H01L 41/042* (2013.01); *H01L 41/0477* (2013.01); *H03B 2200/0018* (2013.01)

(56) References Cited

FOREIGN PATENT DOCUMENTS

| | | |
|---|---|---|
| JP | 2005032879 A | 2/2005 |
| JP | 2007235289 A | 9/2007 |
| JP | 2010183324 A | 8/2010 |
| JP | 2013211752 A | 10/2013 |
| JP | 2015173309 A | 10/2015 |

OTHER PUBLICATIONS

Written Opinion of the International Searching Authority issued for PCT/JP2016/087744, dated Feb. 28, 2017.

\* cited by examiner

PIEZOELECTRIC OSCILLATOR AND PIEZOELECTRIC OSCILLATION DEVICE

CROSS REFERENCE TO RELATED APPLICATIONS

The present application is a continuation of International application No. PCT/JP2016/087744, filed Dec. 19, 2016, which claims priority to Japanese Patent Application No. 2015-254874, filed Dec. 25, 2015, the entire contents of each of which are incorporated herein by reference.

TECHNICAL FIELD

The present invention relates to a piezoelectric oscillator and a piezoelectric oscillation device.

BACKGROUND ART

Piezoelectric oscillators are required to output a stable frequency without being influenced by a change in ambient temperature. Therefore, as described, for example, in Japanese Unexamined Patent Application Publication No. 2013-211752 (Patent Document 1) and Japanese Unexamined Patent Application Publication No. 2010-183324, the output frequency of a piezoelectric resonator is stabilized by performing temperature control to keep the temperature of the piezoelectric resonator at a desirable temperature by using a heater or the like. For example, in Patent Document 1, in order to suppress dissipation of heat from the inside to the outside of a recess that accommodates a piezoelectric resonator, the recess is hermetically sealed with a three-layer structure that is composed of a first metal plate, a resin member, and a second metal plate (see paragraph 0029 and FIG. 3 of Patent Document 1). Patent Document 1 also describes a structure in which a space, instead of the resin member, is provided between the first metal plate and the second metal plate.

However, with these structures, because the second metal plate, which serves as a lid, is joined to the first metal plate, sealability may be impaired due to warping or deforming of some members due to heat, and thus it may not be possible to achieve a sufficient heat insulating effect.

The present invention has been made in consideration of the above circumstances, and an object thereof is to provide a piezoelectric oscillator and piezoelectric oscillation device that can improve sealability and heat insulation ability for a piezoelectric resonator.

BRIEF DESCRIPTION OF THE INVENTION

A piezoelectric oscillator according to an aspect of the present invention includes a base member on which a piezoelectric resonator is mounted, a first lid member that seals the piezoelectric resonator on the base member and a second lid member that seals the first lid member on the base member. The first lid member and the second lid member are each joined to the base member.

With the structure described above, it is possible to avoid or suppress occurrence of a joint failure even if some members deform due to the influence of heat or the like, because the first and second lid members, which seal the piezoelectric resonator, are each joined to the base member. Accordingly, it is possible to suppress dissipation of heat from the inside to the outside of the inner space accommodating the piezoelectric resonator, while reliably and hermetically sealing the piezoelectric resonator with the first and second lid members. Thus, it is possible to provide a piezoelectric oscillator that can improve sealability and heat insulation ability for the piezoelectric resonator.

A piezoelectric oscillation device according to an aspect of the present invention includes the piezoelectric oscillator described above and an integrated circuit element that is electrically connected to the piezoelectric resonator.

With the structure described above, because the piezoelectric oscillator is included, it is possible to provide a piezoelectric oscillation device that can improve sealability and heat insulation ability for the piezoelectric resonator.

With the present invention, it is possible to provide a piezoelectric oscillator and a piezoelectric oscillation device that can improve sealability and heat insulation ability for a piezoelectric resonator.

DESCRIPTION OF EMBODIMENTS

Figure 1:
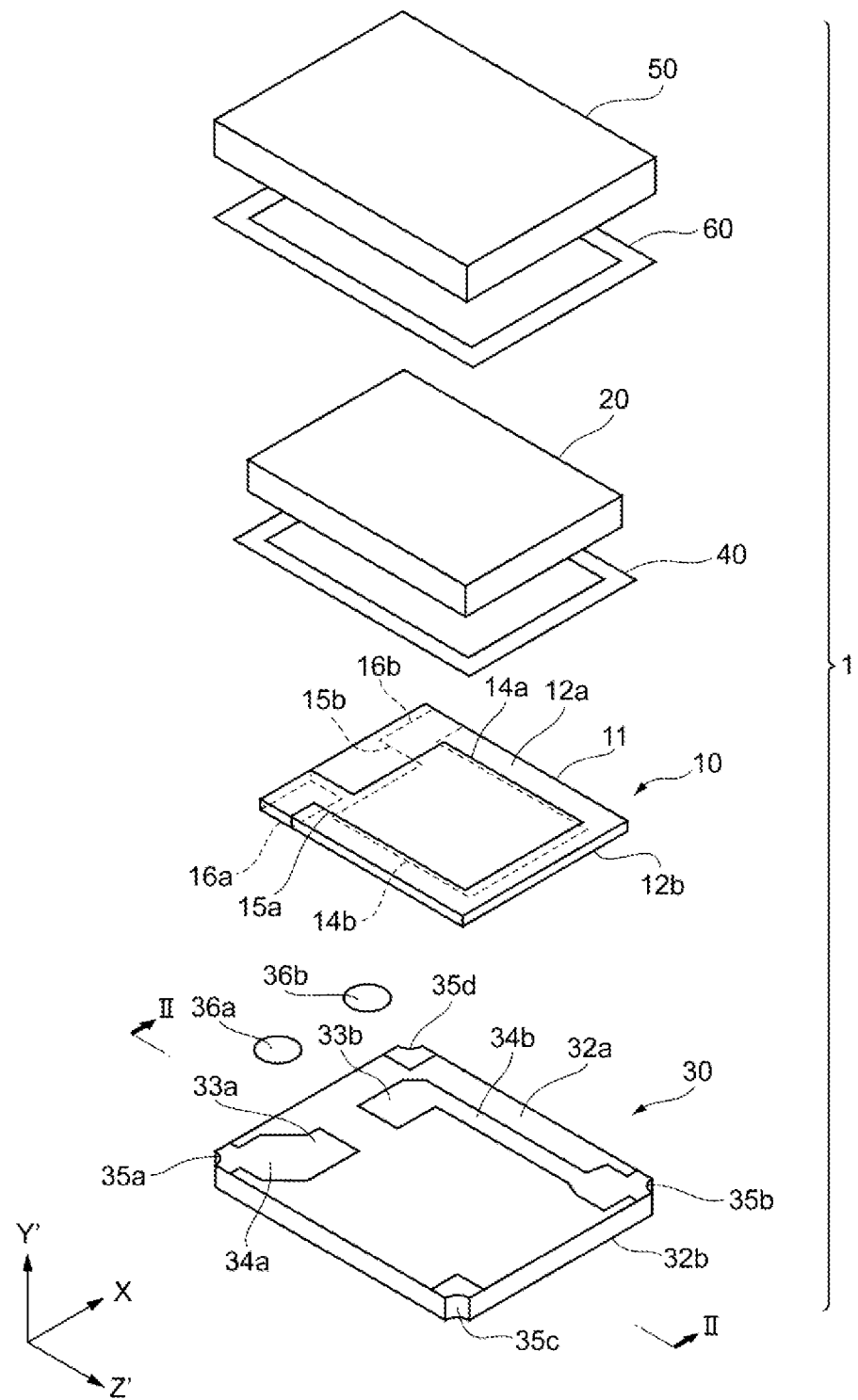
FIG. 1 is an exploded perspective view of a piezoelectric oscillator according to a first embodiment of the present invention.

Hereinafter, embodiments of the present invention will be described. In the drawings used in the following description, elements that are the same as or similar to each other are denoted by the same or similar numerals. The drawings show examples, and the dimensions and shapes of elements in the drawings are schematic. It should be noted that the technical scope of the present invention is not limited to the embodiments described below.

Figure 2:
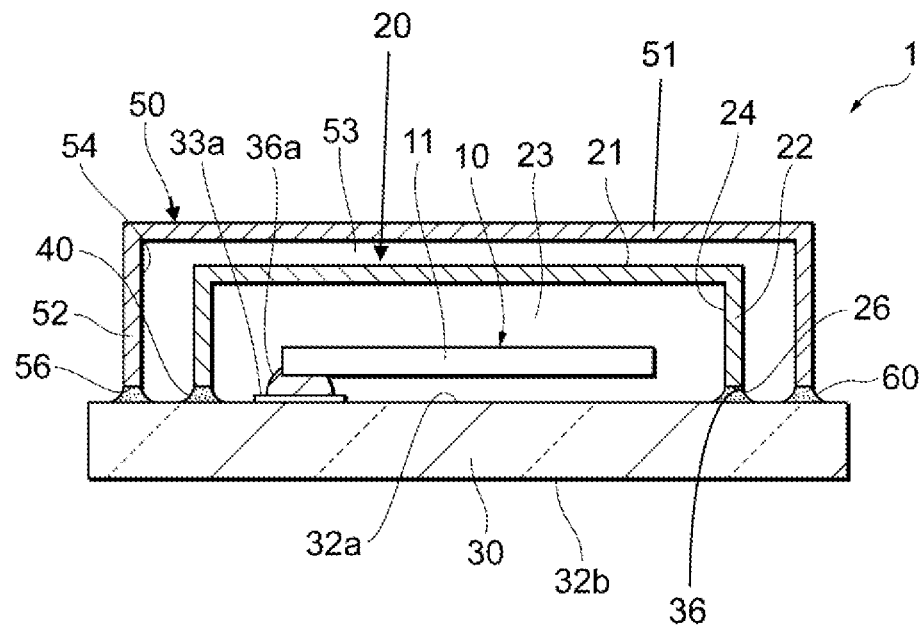
FIG. 2 is a sectional view taken along line II-II of FIG. 1.

Referring to FIGS. 1 and 2, a piezoelectric oscillator according to an embodiment of the present invention will be described. FIG. 1 is an exploded perspective view of the piezoelectric oscillator according to a first embodiment of the present invention, and FIG. 2 is a sectional view taken along line II-II of FIG. 1. In FIG. 2, electrodes of a piezoelectric resonator are not illustrated.

As illustrated in FIG. 1, a piezoelectric oscillator 1 includes a piezoelectric resonator 10, a first lid member or lid member 20, a second lid member or lid member 50 and a substrate or base member 30. The first lid member 20 preferably takes the form of an open cuboid having a top wall 25 and four side walls 22 extending downwardly from the top wall (as viewed in FIG. 2) so as define a recess 24. The first lid member 20 is connected to the upper surface 32a of the substrate 30 by a sealing material 40 (described in further detail below) so as to form a first hermetically sealed space 23. The piezoelectric resonator is housed in the sealed space 23.

The second lid member 50 preferably takes the form of an open cuboid having a top wall 25 and four side walls 52 extending downwardly from the top wall (as viewed in FIG. 2) so as define a recess 54. The second lid member 50 is also connected to the upper surface 32a of the substrate 30 by a sealing material 60 (also described in further detail below) so as to form a second hermetically sealed space 53. In this manner, the first lid member 20, the second lid member 50 and the substrate 30 serve as a housing that hermetically houses the piezoelectric resonator 10.

As best shown in FIG. 1, the piezoelectric resonator 10 includes a piezoelectric substrate 11 and first and second excitation electrodes 14a and 14b formed on opposing main surfaces 12a and 12b of the piezoelectric substrate 11.

The piezoelectric substrate 11 is made of a piezoelectric material. The material is not particularly limited. In the example illustrated in FIG. 1, the piezoelectric substrate 11 is preferably an AT-cut quartz crystal element having a rectangular shape in plan view as seen in the thickness direction. In this case, the piezoelectric resonator 10 is a quartz crystal resonator including an AT-cut quartz crystal element. An AT-cut quartz crystal element is cut so that, when an X-axis, a Y-axis, and a Z-axis are the crystal axes of a synthetic quartz crystal and a Y'-axis and a Z'-axis are respectively axes that are obtained by rotating the Y-axis and the Z-axis around the X-axis by 35 degrees 15 minutes±1 minute 30 seconds in a direction from the Y-axis toward the Z-axis, the quartz crystal element has a main surface that is parallel to a plane defined by the X-axis and the Z'-axis (hereinafter, referred to as "XZ'-plane" and the same applies to planes defined by the other axes). In the example illustrated in FIG. 1, the piezoelectric substrate 11, which is an AT-cut quartz crystal element, has a long-side direction parallel to the Z'-axis, a short-side direction parallel to the X-axis, and a thickness direction parallel to the Y'-axis. The piezoelectric substrate 11 has a rectangular shape when the XZ'-plane is seen in plan view. A quartz crystal resonator using an AT-cut quartz crystal element has high frequency stability in a wide temperature range, has high durability, and can be manufactured at low cost. A vibration in a thickness sheer mode is used as a main vibration of an AT-cut quartz crystal resonator.

A piezoelectric substrate according to the present embodiment is not limited to that described above. For example, the piezoelectric substrate may be an AT-cut quartz crystal element having a long-side direction parallel to the X-axis and a short-side direction parallel to the Z'-axis. Alternatively, and without limitation, the piezoelectric substrate may be a quartz crystal element that is not an AT-cut quartz crystal element (such as a BT-cut quartz crystal element) or may be made of another piezoelectric material, such as a ceramic other than quartz crystal.

The first excitation electrode 14a is preferably formed on the first surface 12a (a surface parallel to the XZ'-plane and on the positive Y' side) of the piezoelectric substrate 11. The second excitation electrode 14b is preferably formed on the second surface 12b (a surface parallel to the XZ'-plane and on the negative Y' side) of the piezoelectric substrate 11, which faces the first surface 12a of the piezoelectric substrate 11. The first and second excitation electrodes 14a and 14b are preferably a pair of electrodes that substantially completely overlap each other in the XZ'-plane. Each of the excitation electrodes 14a and 14b is, for example, rectangular in the XZ'-plane. In this case, the excitation electrodes 14a and 14b are disposed so that, for example, the long-side direction thereof coincides with the long-side direction of the piezoelectric substrate 11.

Connection electrodes 16a and 16b are formed on the piezoelectric substrate 11. The connection electrode 16a is electrically connected to the first excitation electrode 14a via an extension electrode 15a and the connection electrode 16b is electrically connected to the second excitation electrode 14b via an extension electrode 15b. To be specific, the extension electrode 15a extends on the first surface 12a from the first excitation electrode 14a toward a short side on the negative Z' side, passes along a side surface of the piezoelectric substrate 11 on the negative Z' side, and is connected to the connection electrode 16a formed on the second surface 12b. The extension electrode 15b extends on the second surface 12b from the second excitation electrode 14b toward the short side on the negative Z' side and is connected to the connection electrode 16b formed on the second surface 12b. The connection electrodes 16a and 16b are disposed along the short side on the negative Z' side. The connection electrodes 16a and 16b are electrically connected to, and mechanically held by, the substrate 30 via electroconductive holding members 36a and 36b (described below). Note that, in the present embodiment, the dispositions and the patterns of the connection electrodes 16a and 16b and the extension electrodes 15a and 15b are not particularly limited and may be modified in consideration of electrical connection with other members.

The electrodes described above, including the first and second excitation electrodes 14a and 14b, may each include a chrome (Cr) underlying layer and a gold (Au) layer formed on the surface of the chrome layer. The materials of these electrodes are not particularly limited.

As illustrated in FIG. 2, the first lid member 20 has a recess 24 that opens so as to face a first surface 32a of the substrate 30. The recess 24 is defined by a top wall 21 and the four side walls 22, which extend downwardly from the edges of the top wall around entire periphery of the opening. In this embodiment, the lower edges of the first lid member 20a have facing surfaces 26 which face the first surface 32a of the substrate 30 and are hermetically sealed to the substrate by a sealing material 40 (see FIGS. 1 and 2).

The material of the first lid member 20, which is not particularly limited, may be an electroconductive material, such as a metal. When a metal cap is used and electrically connected to a ground potential, it is possible to provide a shielding function to the first lid member 20. Alternatively, the first lid member 20 may be made of an insulating material or may have a composite structure composed of an electroconductive material and an insulating material.

In the example illustrated in FIG. 2, joining surfaces 36 defined by the bottom edges of the side walls 22 face the upper surface 32a of the substrate 30 and are joined to the substrate 30 by the sealing material 40. However, the shape of the lid member is not so limited. For example, the first lid member 20 may have a flange portion that protrudes outwardly from the side wall 22 and the flange portion may have the joining surface 26 that faces the substrate 30 (and is hermetically sealed to the substrate 30 by the sealing material 40). When the flange portion is used, the area of joint between the first lid member 20 and the substrate 30 can be increased and the strength of joint between the first lid member and the substrate can be improved.

The piezoelectric resonator 10 is mounted on the upper surface 32a of the substrate 30. In the example illustrated in FIG. 1, the substrate 30 has a long-side direction parallel to the Z'-axis, a short-side direction parallel to the X-axis, and a thickness direction parallel to the Y'-axis. The substrate 30 is rectangular in the XZ'-plane. The substrate 30 is preferably a rigid substrate and 30 may be made of, by way of example, an insulating ceramic. As alternative examples, the substrate 30 may be made of a glass material (such as a material mainly composed of a silicate glass, or a material that is mainly composed of a substance other than silicate glass and that exhibits a glass transition due to increase in temperature), a quartz crystal material (such as an AT-cut quartz crystal), or a glass epoxy resin, which is formed by impregnating glass fibers with an epoxy-based resin. The substrate 30 may be a single-layer substrate or a multi-layer substrate. When the substrate 30 is a multi-layer substrate, the substrate 30 may have an insulating layer formed as an uppermost layer at the first surface 32a. The substrate 30 may have a flat-plate-like shape, or may have a recessed shape that opens so as to face the first lid member as described below. As illustrated in FIG. 2, when the first lid member 20 and the substrate 30 are joined to each other via the sealing material 40, the piezoelectric resonator 10 is hermetically sealed in the first sealed space 23, which is an inner space (cavity) surrounded by the recess 24 of the first lid member 20 and the substrate 30.

As best shown in FIG. 1, the sealing material 40 extends along the entire bottom periphery of the first lid member 20 between the joining surface 26 and the substrate 30. The sealing material 40 may be an insulating material. Examples of the insulating material include a glass material (such as a low-melting glass) and a resin material (such as an epoxy resin). The cost of such an insulating material is lower than that of a metal joint. Moreover, by using such an insulating material, the heating temperature can be reduced and the manufacturing process can be simplified. In the case of additionally providing a shielding function to the first lid member 20, the first lid member 20 may be joined to the substrate 30 via the sealing material 40 while providing electrical connection to the first lid member 20.

As best illustrated in FIG. 2, the second lid member 50 has a recess 54 that opens so as to face the first surface 32a of the substrate 30. The recess 54 is larger than that of the recess 24 of the first lid member 20 so that the first lid member 20 can be disposed in the recess 54. The recess 54 preferably takes the form of an open cuboid having a top wall 51 and four side walls 52 which extend downwardly from the outer edges of the top wall 51 along the entire periphery of the opening. The bottom of the side walls 52 have a joining surface 56 which faces the first surface 32a of the substrate 30 and are hermetically sealed to the substrate by a sealing material 60.

The material of the second lid member 50 is not particularly limited. The materials described above regarding the first lid member 20 can be used for the second lid member 50. The material of the second lid member 50 may be the same as or different from that of the first lid member 20.

The shape of the second lid member 50 is also not particularly limited. As with the first lid member 20, the second lid member 50 may have, for example, a flange portion (and the joining surface 56 may be formed on the flange portion).

As illustrated in FIG. 2, when the second lid member 50 and the substrate 30 are joined via the sealing material 60, both the piezoelectric resonator 10 and the first lid member 20 are sealed in a second sealed space 53, which is an inner space (cavity) surrounded by the recess 54 of the second lid member 50 and the substrate 30. In this embodiment, the second lid member 50 is disposed on the first surface 32a of the substrate 30 at a predetermined distance from the first lid member 20 so as to form the second sealed space 53 outside of the first lid member 20. The second sealed space 53 may be a space that surrounds a top surface and the entire side surface of the first lid member 20 on the first surface 32a of the substrate 30. The air pressure in the second sealed space 53 may be lower than the outside air pressure and may be, for example, a vacuum. Such a space can be obtained by joining the second lid member 50 to the substrate 30 under a vacuum or a low pressure condition. Alternatively, a low-pressure sealed space 53 may be obtained by joining the second lid member 50 to the substrate 30, then heating the second sealed space 53, and subsequently cooling the second sealed space 53 to room temperature.

As best shown in FIG. 1, the sealing material 60 extends along the entire interface between the joining surfaces 56 (FIG. 2) of the second lid member 50 and the first surface 32a of the substrate 30. The material of the sealing material 60 is not particularly limited. The materials described above regarding the sealing material 40 for joining the first lid member 20 can be used for the sealing material 60, as appropriate. The material of the sealing material 60 may be the same as or different from the material of the sealing material 40.

In the example illustrated in FIG. 2, one end of the piezoelectric resonator 10 (an end adjacent to the electroconductive holding members 36a and 36b) is a fixed or proximal end, and the other end of the piezoelectric resonator 10 is a free or distal end. As a modification, the piezoelectric resonator 10 may be fixed to the substrate 30 at both ends thereof in the long-side direction, i.e., the left and right directions as viewed in FIG. 2.

As illustrated in FIG. 1, the substrate 30 includes connection electrodes 33a and 33b formed on the first surface 32a, extension electrodes 34a and 34b extending from the connection electrodes 33a and 33b toward an outer edge of the first surface 32a and outer electrodes 35a and 35b connected to the extension electrodes 34a and 34b, respectively. The connection electrodes 33a and 33b are preferably disposed inside of the outer edge of the substrate 30 so that the piezoelectric resonator 10 can be disposed at substantially the center of the first surface 32a of the substrate 30.

The connection electrode 16a of the piezoelectric resonator 10 is connected to the connection electrode 33a via the electroconductive holding member 36a. The connection electrode 16b of the piezoelectric resonator 10 is connected to the connection electrode 33b via the electroconductive holding member 36b. The electroconductive holding members 36a and 36b can be obtained by, for example, thermally curing an electroconductive adhesive.

The extension electrode 34a extends from the connection electrode 33a toward one of the corners of the substrate 30. The extension electrode 34b extends from the connection electrode 33b toward another corner of the substrate 30. A plurality of outer electrodes 35a, 35b, 35c, and 35d are formed at the corners of the substrate 30. In the example illustrated in FIG. 1, the extension electrode 34a is connected to the outer electrode 35a, which is formed at the corner in the negative X-direction and negative Z'-direction. The extension electrode 34b is connected to the outer electrode 35b, which is formed at the corner in the positive X-direction and positive Z'-direction. As illustrated in FIG. 1, the outer electrodes 35c and 35d are formed at the remaining corners. The outer electrodes 35c and 35d may be dummy electrodes that are not electrically connected to the excitation electrodes of the piezoelectric resonator 10 or other electric components mounted on the substrate 30. By forming such dummy electrodes, application of an electroconductive material for forming the outer electrodes can be facilitated. Moreover, because the outer electrodes can be formed at all corners, a process of electrically connecting the piezoelectric vibrator to another component can be facilitated. The dummy electrodes 35c and 35d may, for example, be ground electrodes to which a ground potential is supplied. When the first lid member 20 is made of an electroconductive material, it is possible to additionally provide a shielding function to the first lid member 20 by connecting the first lid member 20 to the outer electrodes 35c and 35d that are ground electrodes. The same applies to the second lid member 50.

In the example illustrated in FIG. 1, each of the corners of the substrate 30 has a respective cutout side surface that is formed by partially cutting out the corner in a cylindrically-curved shape (also referred to as a castellation shape). The outer electrodes 35a to 35d are each formed continuously on the cutout side surfaces and a second surface 32b. However, the shape of each of the corners of the substrate 30 is not so limited. For example, each of the corners may be cut out so as to have a planar shape, or may have a rectangular shape with four right-angled corners without being cut out, in plan view.

The structures of the connection electrodes, the extension electrodes, and the outer electrodes of the substrate 30 are not limited to the examples described above, and may be modified in various ways. For example, the connection electrodes 33a and 33b may be disposed on different sides on the first surface 32a of the substrate 30 by, for example, forming one of the connection electrodes 33a and 33b on the positive Z' side and forming the other on the negative Z' side. With such a structure, the piezoelectric resonator 10 is supported by the substrate 30 at both ends thereof in the long-side direction (i.e., the horizontal direction as viewed in FIG. 2). The number of outer electrodes is not limited to four, and, for example, only two outer electrodes may be disposed at diagonally opposite corners. The outer electrodes need not be disposed at the corners, and may be formed on one of the side surfaces of the substrate 30 excluding the corners. In this case, cutout side surfaces may be formed by partially cutting out the side surfaces so as to form cylindrically-curved surfaces as described above and the outer electrodes may be formed on the side surfaces excluding the corners. The other outer electrodes 35c and 35d, which are dummy electrodes, need not be formed. Through-holes may be formed in the substrate 30 so as to extend from the first surface 32a to the second surface 32b, and connection electrodes formed on the first surface 32a may be electrically connected to the second surface 32b through the through-holes.

With the piezoelectric oscillator 1 illustrated in FIG. 1, by applying an alternating-current voltage between the pair of first and second excitation electrodes 14a and 14b of the piezoelectric resonator 10 via the outer electrodes 35a and 35b of the substrate 30, the piezoelectric substrate 11 vibrates in a predetermined vibration mode, such as a thickness shear mode, and oscillation characteristics due to the vibration can be obtained.

In the piezoelectric oscillator according to the present embodiment, the piezoelectric resonator 10 is doubly sealed with the first and second lid members 20 and 50 on the substrate 30. That is, the piezoelectric resonator 10 is hermetically sealed in the first sealed space (inner space) 23 in the recess 24 of the first lid member 20 on the first surface 32a of the substrate 30 and both the piezoelectric resonator 10 and the first lid member 20 are hermetically sealed in the second sealed space (inner space) 53 in the recess 54 of the second lid member 50 on the first surface 32a of the substrate 30. Because the first and second lid members 20 and 50 are each joined to the substrate 30 as described above, each of the lid members can be stably joined to the substrate 30. That is, it is possible to avoid or at least suppress occurrence of a joint failure, even if some members deform due to the influence of heat or the like. Moreover, because the first and second lid members 20 and 50 are each joined to the substrate 30, it is possible to prevent a stress applied to one of joint portions from influencing the other joint portion. Accordingly, it is possible to suppress dissipation of heat from the inside to the outside of an inner space accommodating the piezoelectric resonator 10, while reliably and hermetically sealing the piezoelectric resonator 10 with the first and second lid members 20 and 50.

Preferably, the outermost surface of the first lid member 20 and the innermost surface of the second lid member 50, which face each other, each have electroconductivity. It may occur that the first lid member 20 and the second lid member 50 become displaced from predetermined positions or deform from predetermined shapes due to an excessive pressure, an external force generated by interference with the outside, and displacement of mounting positions. In this case, when the outermost surface of the first lid member 20 and the innermost surface of the second lid member 50 each have electroconductivity, an advantage is obtained in that it is possible to easily detect contact between the first lid member 20 and the second lid member 50 through electrical detection of a change in resistance or a change in capacitance. By providing a metal part in at least an inner wall of the first or second lid members 20 and 50, an advantage is obtained in that the reflectance of radiation heat can be increased and the heat insulating effect can be increased. Preferably, the metal part of the inner wall has a surface roughness Ra of 20 nm or less so that a heat insulating effect can be obtained, and, more preferably, has a mirror surface having Ra of 5 nm or less so that a higher heat insulating effect can be obtained. The metal part of the inner wall may be realized, for example, by using a metal as the material of the first lid member 20 or the second lid member 50, or by forming a thin metal film on a surface of an insulating material, such as a resin material or a ceramic material.

The air pressure in the inner space 23 formed by the first lid member 20 may be lower than the outside air pressure (standard atmospheric pressure). The air pressure in the second sealed space 53, which is formed outside of the first lid member 20 by the second lid member 50, may also be lower than the outside air pressure (atmospheric pressure). By making the pressures of spaces 23 and 53, formed by hermetically sealing the piezoelectric resonator 10, lower than the outside air pressure, it is possible to further suppress dissipation of heat from the inside to the outside of the inner space 23 accommodating the piezoelectric resonator 10.

Figure 3:
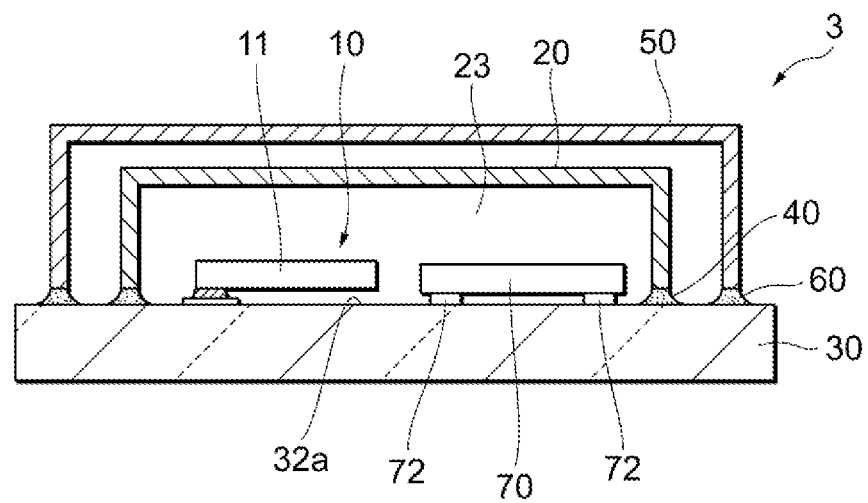
FIG. 3 is a sectional view of a piezoelectric oscillation device according to a first variation of the first embodiment of the present invention.

Next, a first modification of the first embodiment of the present invention will be described. FIG. 3 is a sectional view of the piezoelectric oscillation device according to the present embodiment. The piezoelectric oscillation device 3 includes the piezoelectric oscillator 1 described above and an integrated circuit element 70, which is an example of an electronic component.

As illustrated in FIG. 3, the integrated circuit element 70 may be mounted on the first surface 32a of the substrate 30. To be specific, a plurality of electrodes 72, which are formed on an integrated-circuit-surface of the integrated circuit element 70, may be mounted in a direction facing the first surface 32a of the substrate 30. In this case, the integrated circuit element 70 may be hermetically sealed, together with the piezoelectric resonator 10, in the first sealed space 23 formed by the first lid member 20.

The integrated circuit element 70 is electrically connected to the piezoelectric resonator 10 and preferably includes an oscillation circuit for generating a reference signal, such as a clock signal. The integrated circuit element 70 may include, in addition to the oscillation circuit, a predetermined circuit that is necessary for the piezoelectric oscillator 1 to perform a predetermined operation. For example, the integrated circuit element 70 may include a temperature sensor for detecting the temperature of the piezoelectric resonator 10, a heating element for heating the piezoelectric resonator 10, and a control circuit for controlling the temperature sensor and/or the heating element. The heating element supplies heat for controlling the temperature of the piezoelectric resonator 10, which is hermetically sealed with the first and second lid members 20 and 50, to be in a predetermined temperature range via, for example, a heat conductive portion (not shown), such as a metal portion, that is formed in the substrate 30. The heating element may perform heating in accordance with a command value calculated by the control circuit in accordance with a detection value of the temperature sensor. The integrated circuit element 70 may include only one of the temperature sensor, the heating element, and the control circuit and the remaining elements may be disposed in the first sealed space 23 independently from the integrated circuit element 70.

Because the present embodiment includes the piezoelectric oscillator 1, it is possible to suppress dissipation of heat which is supplied by the heating element of the integrated circuit element 70 to the first sealed space (inner space) 23 of the first lid member 20 via the substrate 30, to the outside.

Figure 4:
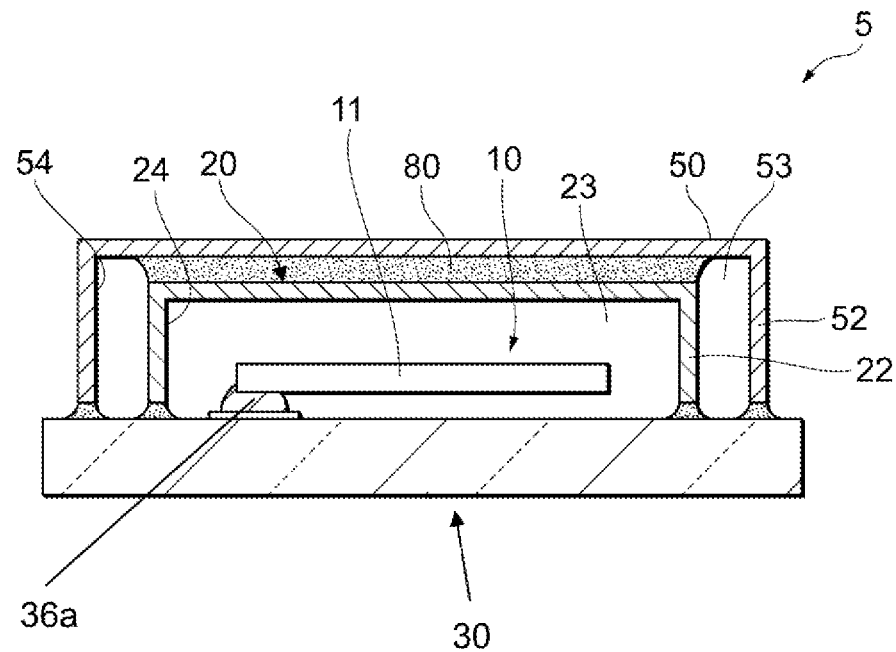
FIG. 4 is a sectional view of a piezoelectric oscillator according to a second variation of the second embodiment of the present invention.

A second modification of the first embodiment is shown in FIG. 4. The present modification differs from the first embodiment in that a heat insulating member (e.g., a resin layer 80) is disposed in at least a part of the second sealed space 53 formed by the second lid member. The term "heat insulating member" refers to a member that has a higher heat insulating effect than outside air (atmospheric pressure).

The resin layer 80 may be disposed in part or all of the second sealed space 53. For example, and as illustrated in the figure, the resin layer 80 may be disposed between the top surface of the first lid member 20 (a surface opposite to the bottom surface of the recess 24) and the bottom surface of the top wall 51 of the recess 54 lid member. The resin layer 80 may be disposed so as to cover the entirety of the top surface of the first lid member 20. Alternatively, the resin layer 80 may be disposed between at least one outer surface of the side walls 22 of the first lid member 20 and at least one inner surface of the side walls 52 of the second lid member 50. Yet alternatively, the resin layer 80 may be disposed so as to fill the entirety of the second sealed space 53.

The resin layer 80 may have bubbles therein. By having the bubbles, the resin layer 80 can have a higher heat insulating effect. However, the heat insulating member is not limited to a resin layer. As long as a heat insulating member has a higher heat insulating effect than outside air, another member made of an inorganic material or a composite material of inorganic and organic materials may be used.

With the piezoelectric oscillator according to the present modification, because a heat insulating member, such as the resin layer 80, is disposed in at least a part of the sealed space 53 formed by the second lid member 50, it is possible to further suppress dissipation of heat from the inside to the outside of the inner space 23 accommodating the piezoelectric resonator 10.

Figure 5:
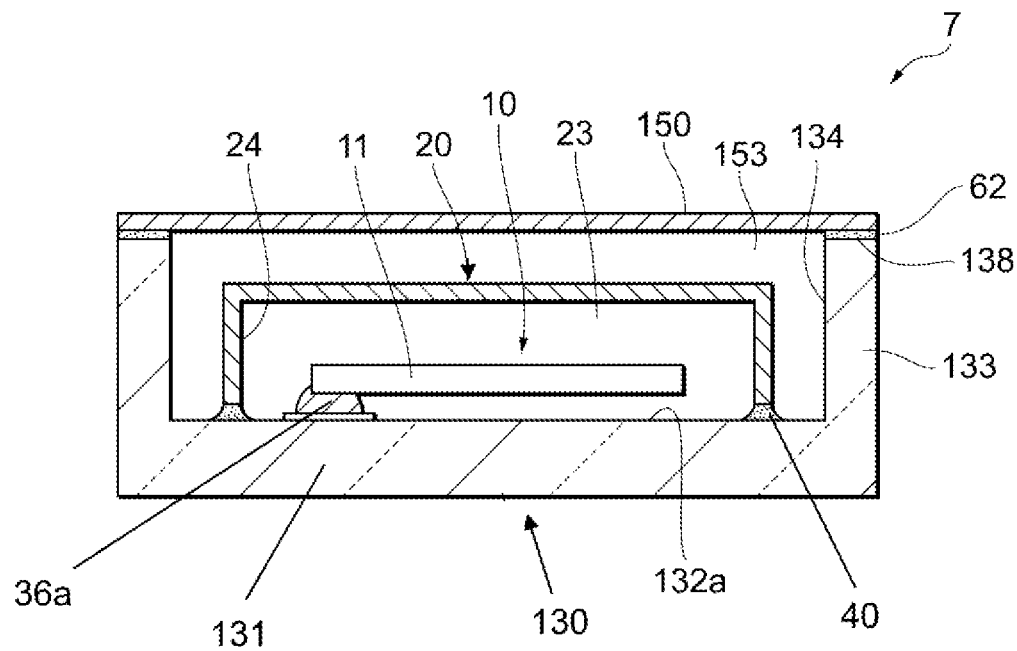
FIG. 5 is a sectional view of a piezoelectric oscillator according to a second embodiment of the present invention.
Figure 6:
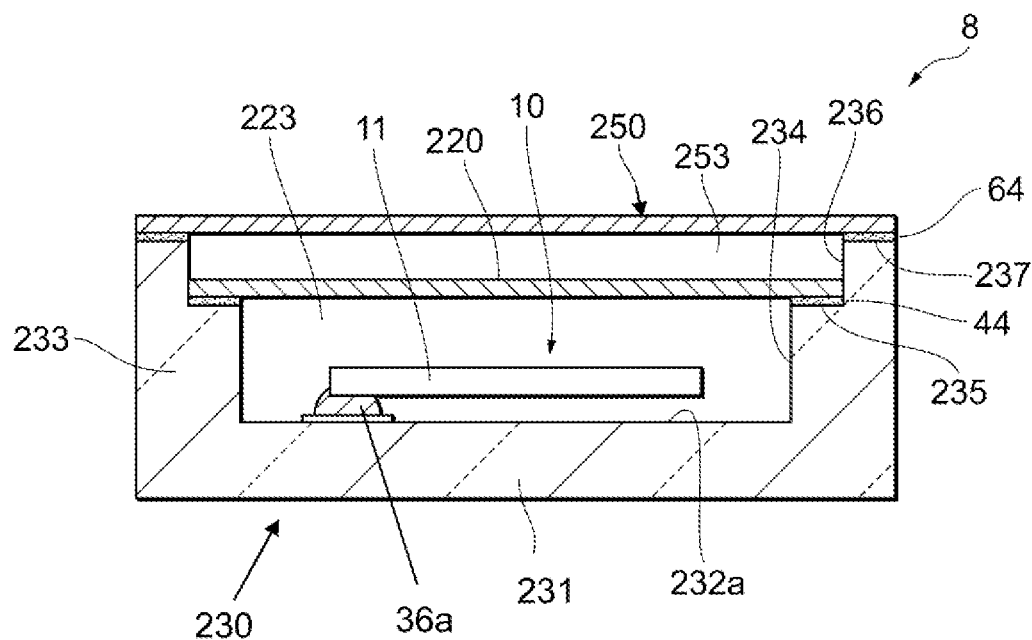
FIG. 6 is a sectional view of a piezoelectric oscillator according to a third embodiment of the present invention.
Figure 7:
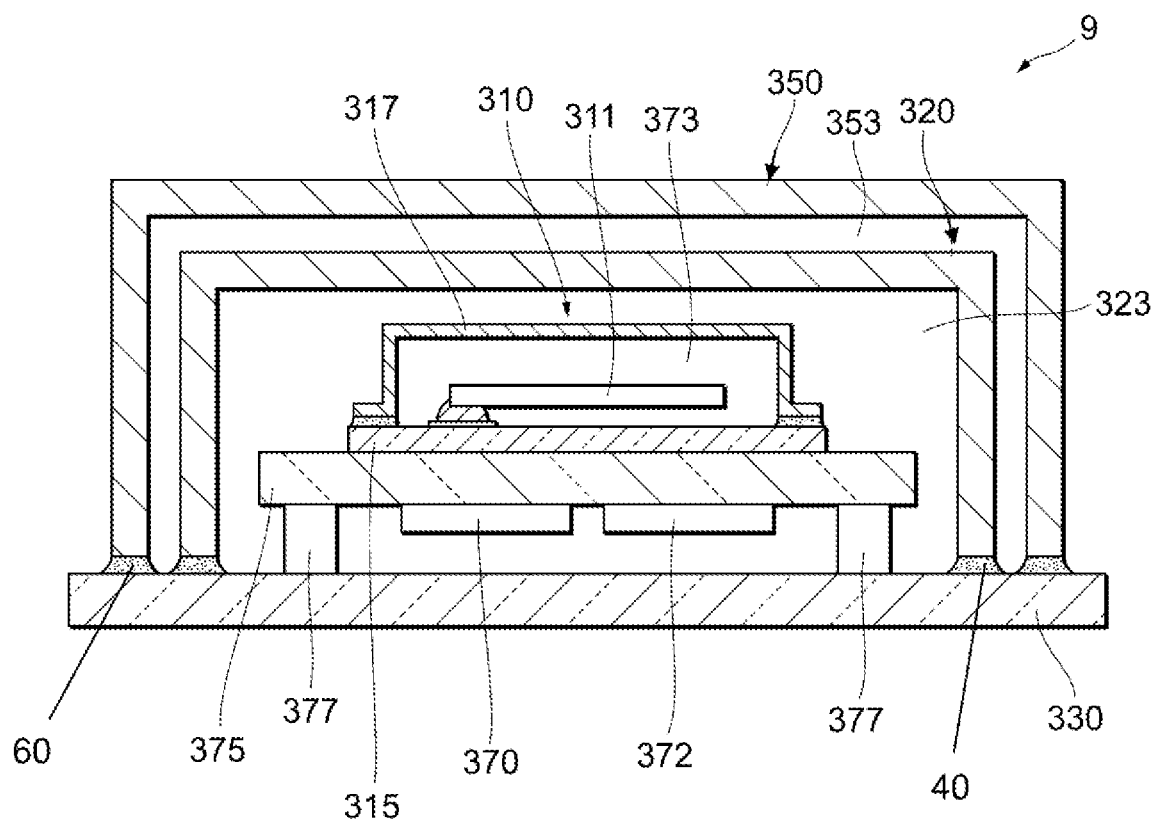
FIG. 7 is a sectional view of a piezoelectric oscillation device according to a fourth embodiment of the present invention.

The present invention is not limited to the above described embodiment and its variations and may be modified in various ways. By way of example and not limitation, FIGS. 5 to 7 illustrate alternative piezoelectric oscillators according to the present embodiment. In each of the following embodiments, differences from the above embodiment will be described, and elements that are the same as those of the embodiment are denoted by the same numerals in the drawings.

FIG. 5 illustrates a piezoelectric oscillator 7 according to a second embodiment of the present invention. The present embodiment differs from the embodiment in the structures of the base member and the second lid member.

As illustrated in FIG. 5, the piezoelectric oscillator 7 includes a base member 130 having a bottom wall 131 and four side walls 133 extending upwardly from outer periphery of the bottom wall 131. The bottom wall 131 and the side walls 133 cooperate to define a recess 134 having an open upper end (as viewed in FIG. 5). The piezoelectric resonator 10 is mounted on the upper surface 132*a* of the bottom wall 131 and is hermetically sealed in an inner space 23 defined by the recess 24 of the first lid member 20, the upper surface 132*a* of the bottom wall 131 of the base member 130 and the sealing material 40. A second lid member 150 is joined to a joining edge 138 of the side walls 133 of the base member 130 via a sealing material 62. The second lid member 150 may have a flat plate-like shape as illustrated in FIG. 5. Alternatively, as with the second lid member 50 described above, the second lid member 150 may have a recess that opens so as to face the base member 130.

The second lid member 150 is disposed at a predetermined distance from the first lid member 20 so as to form a sealed space 153 outside of the first lid member 20. The sealed space 153 may be a space that surrounds the top and side surfaces of the first lid member 20 in the recess 134 of the base member 130.

FIG. 6 illustrates a piezoelectric oscillator 8 according to a third embodiment of the present invention. The present embodiment differs from the second embodiment in the structures of the substrate and the first lid member.

As illustrated in FIG. 6, the base member 230 has a first recess 234 (which is open on its upper end) defined by the upper surface 232*a* of the bottom wall 231 of the base member 230 and the inner surfaces of four side walls 233 extending upwardly along the perimeter of the bottom wall 231 (all as viewed in FIG. 6). A second recess 236 is located above the first recess 234 and has larger dimensions (in this case length and width dimensions) than the dimensions of the first recess 234.

The piezoelectric resonator 10 is mounted on a upper surface 232*a* of the bottom wall 231. A first lid member 220 is joined to a joining edge 235 of the first recess 234 in the side walls 233 via a sealing material 44 so as to define a hermetically sealed inner space 223.

A second lid member 250 is joined to joining edges 237 of the second recess 236 in the side walls 233 via a sealing material 64 thereby forming a second hermetically sealed space 253 defined by the first and second lid members 220, 250 and the inner surfaces of the side walls 233 defining the second recess 236.

The first and second lid members 220 and 250 may each have a flat plate-like shape as illustrated in FIG. 6. Alternatively, as with the first lid member 20 and the second lid member 50 described above, the first lid member 220 and the second lid member 250 may each have a recess that opens so as to face the base member 230.

The second lid member 250 is disposed at a predetermined distance from the first lid member 220 so as to form a sealed space 253 above the first lid member 220. The sealed space 253 may be a space that is located above the top surface of the first lid member 220 in the recess 234 of the base member 230.

With the piezoelectric oscillators according to the embodiments illustrated in FIGS. 5 and 6, as with the first embodiment, because the lid members 220, 250 are each joined to the base member 230, it is possible to suppress dissipation of heat from the inside to the outside of the inner space accommodating the piezoelectric resonator 10, while reliably and hermetically sealing the piezoelectric resonator 10 with the lid members.

FIG. 7 illustrates a piezoelectric oscillation device 9 according to a fourth embodiment of the present invention. In the present embodiment, a piezoelectric resonator 310 is mounted on a substrate holding member 375 and the piezoelectric resonator 310 and the substrate holding member 375 are accommodated in a first sealed space 323 formed by a first lid member 320 which is coupled to a base member 330 by a sealing material 40. The first lid member 320 is accommodated in a second sealed space 353 formed by a second lid member 350 which is coupled to the base member 330 by a sealing material 60. The piezoelectric resonator 310, which is accommodated in the first sealed space 323, includes a substrate 315, a piezoelectric substrate 311, which is preferably an AT-cut quartz crystal element, and a lid member 317, which is joined to the substrate 315 so that the piezoelectric substrate 311, which is an AT-cut quartz crystal element, is accommodated in a third sealed space 373. The substrate 315 of the piezoelectric resonator 310, which is a preferably a quartz crystal resonator, is mounted on a front surface of the substrate holding member 375. An integrated circuit element 370 and a heating element 372 are mounted on a bottom surface of the substrate holding member 375. The substrate holding member 375 is preferably held by the base member 330 at a predetermined distance from the base member 330 via spacers 377. The integrated circuit element 370 is electrically connected to the piezoelectric resonator 310. The integrated circuit element 370 preferably includes an oscillation circuit for generating a reference signal, such as a clock signal, a temperature sensor for detecting the temperature of the first sealed space 323 and a control circuit for controlling the temperature sensor and/or the heating element. The heating element 372 is preferably electrically connected to the integrated circuit element 370 and generates heat to control the temperature of the piezoelectric resonator 310 to be in a predetermined temperature range in accordance with a command value calculated by the control circuit. The command value is calculated by the control circuit in accordance with a detection value of the temperature sensor. In order to stabilize the temperature of the piezoelectric resonator 310, preferably, the heat capacity of the third sealed space 373, which accommodates the piezoelectric substrate 311 that is a quartz crystal element, is smaller than the heat lid capacity of the first sealed space 323, which accommodates the heating element 372. To be specific, the volume of the first sealed space 323 is larger than the volume of the third sealed space 373. In order to obtain the piezoelectric oscillation device 9 that has a smaller size and a sufficient volume and that can operate at a stable temperature, preferably, the minimum distance between the first lid member 320 and the lid member 317 is larger than the minimum distance between the first lid member 320 and the second lid member 350.

As described above, the piezoelectric oscillator and the piezoelectric oscillation device according to the disclosed embodiments of the present invention, can provide the following advantages.

Because of the use of the first and second lid members (which are sealed to the base member) described above, it is possible to avoid or suppress occurrence of a joint failure even if some members deform due to the influence of heat or the like. Accordingly, it is possible to suppress dissipation of heat from the inside to the outside of the inner space accommodating the piezoelectric resonator, while reliably and hermetically sealing the piezoelectric resonator with the first and second lid members. Thus, it is possible to provide a piezoelectric oscillator that can improve sealability and heat insulation ability for the piezoelectric resonator.

With the structures described above, because the second sealed space formed by the second lid member has an air pressure lower than the outside air pressure or is a vacuum (JIS Z8126-1), it is possible to further suppress dissipation of heat from the inside to the outside of the inner space 23 accommodating the piezoelectric resonator 10. Preferably, the degree of vacuum of the first or second sealed space is in the range of 104 to 10-5 Pa, and more preferably, in the range of 103 to 10-3 Pa in order to increase the heat insulation ability of the first or second sealed space and to obtain a sealing structure that can be manufactured easily. Low vacuum is preferable, in view of ease of manufacturing. By joining a lid member to a substrate at a temperature that is higher than room temperature (about 25° C.) by 40° C. or more, a low-pressure environment in the sealed space can be realized at room temperature. Moreover, the second sealed space, which has a pressure between the outside air pressure and the pressure in the first sealed space, is formed. In this case, it is possible to make the pressure difference between the outside air pressure and the pressure in the second sealed space and the pressure difference between the pressure in the second sealed space and the pressure in the first sealed space be smaller than a pressure difference when the outside air pressure and the first sealed space are located adjacent to each other with only the first lid member therebetween. Due to the reduction in pressure difference, it is possible to obtain an advantage in that leakage of the sealed space is prevented or an advantage in that a sealed space can be realized by using a sealing material that has a relatively low pressure resistance.

With the structures described above, because the heat insulating member, such a resin layer, is disposed in at least a part of the sealed space formed by the second lid member, dissipation of heat from the inside to the outside of the inner space accommodating the piezoelectric resonator can be further suppressed. When the resin layer includes bubbles, the heat insulating effect can be further increased.

Each of the embodiments is described above in order to facilitate understating of the present invention and does not limit the scope of the present invention. The present invention can be modified/improved within the scope and sprit thereof, and the present invention includes the equivalents thereof. That is, modifications in design that are made on each of the embodiments by a person having ordinary skill in the art are included in the scope of the present invention, as long as such modifications have features of the present invention. For example, the dispositions, materials, shapes, and sizes of elements of the embodiments are not limited to those in the examples described above and may be changed as appropriate. Elements of the embodiments may be used in any combination as long as the combination is technologically feasible, and such combinations are within the scope of the present invention as long as they include the features of the present invention.

The invention claimed is:

1. A piezoelectric oscillator comprising:
a base member;
a first lid member disposed on and joined to a first main surface of the base member so as to define a first sealed space;
a piezoelectric resonator accommodated in the first sealed space;
a second lid disposed on and joined to the base member so as to define a second sealed space, the first lid member being located in the second sealed space;
wherein:
the base member has a recess;
the piezoelectric resonator is mounted on a bottom surface of the recess of the base member;
the first lid member has a recess that opens so as to face the bottom surface of the recess of the base member on which the piezoelectric resonator is mounted and the piezoelectric resonator is disposed in the recess of the first lid member; and
the second lid member is joined to a joining edge of the recess of the base member which joining edge is located above the bottom surface of the recess of the base member.

2. The piezoelectric oscillator according to claim 1, wherein:
the second lid member has a recess that opens so as to face the first surface of the base member, the second lid member has a size that accommodates the first lid member with a space therebetween; and
the first lid member is disposed in the recess of the second lid member.

3. A piezoelectric oscillator comprising:
a base member;
a first lid member disposed on and joined to a first main surface of the base member so as to define a first sealed space;
a piezoelectric resonator accommodated in the first sealed space;
a second lid disposed on and joined to the base member so as to define a second sealed space, the first lid member being located in the second sealed space;
wherein:
the base member has first recess and a second recess that is disposed outside of the first recess, the dimensions of the second recess being larger than the dimensions of the first recess;
the piezoelectric resonator is mounted on a bottom surface of the first recess of the base member;
the first lid member is joined to a joining edge of the first recess of the base member; and
the second lid member is joined to a joining edge of the second recess of the base member.

4. A piezoelectric oscillator comprising:
a base member;
a first lid member disposed on and joined to a first main surface of the base member so as to define a first sealed space;
a piezoelectric resonator accommodated in the first sealed space;
a second lid disposed on and joined to the base member so as to define a second sealed space, the first lid member being located in the second sealed space;
wherein a pressure in the second sealed space is between $10^4$ and $10^{-5}$ Pa and is lower than an air pressure surrounding the second sealed space.

5. The piezoelectric oscillator according to claim 4, wherein the second sealed space is a vacuum.

6. The piezoelectric oscillator according to claim 4, wherein the air pressure in the first sealed space is less than the air pressure in the second sealed space.

7. The piezoelectric oscillator according to claim 1, wherein a heat insulating member is disposed in at least a part of the second sealed space.

8. The piezoelectric oscillator according to claim 7, wherein the heat insulating member is a resin layer.

9. The piezoelectric oscillator according to claim 8, wherein the resin layer includes bubbles.

10. The piezoelectric oscillator according to claim 1, wherein the piezoelectric resonator is a quartz crystal resonator.

11. The piezoelectric oscillator according to claim 10, wherein the quartz crystal resonator includes a substrate, a quartz crystal element and a third lid member that is joined to the substrate so as to accommodate the quartz crystal element in a third sealed space.

12. The piezoelectric oscillator according to claim 10, wherein the air pressure in the first sealed space is less than the air pressure in the third sealed space.

13. A piezoelectric oscillation device comprising:
the piezoelectric oscillator according to claim 1; and
an integrated circuit element that is electrically connected to the piezoelectric resonator.

14. The piezoelectric oscillation device according to claim 13, further comprising:
a substrate holding member that is accommodated in the first sealed space and on which the piezoelectric resonator is mounted the substrate holding member being supported by the base member at a predetermined distance from the base member;
a temperature sensor that is accommodated in the first sealed space and that is connected to a control circuit of the integrated circuit element, the temperature sensor sensing the temperature of the first sealed space; and
a heating element that is accommodated in the first sealed space and that heats the piezoelectric resonator in accordance with a command value that is calculated by the control circuit as a function of the temperature detected by the temperature sensor.

15. The piezoelectric oscillation device according to claim 14, further comprising a third lid member located on the substrate holding member and enclosing the piezoelectric resonator in a third sealed space.

16. The piezoelectric oscillation device according to claim 15, wherein the heat capacity of the first sealed space is less than the heat capacity of the third sealed space.

17. A piezoelectric oscillation device comprising:
the piezoelectric oscillator according to claim 3;
an integrated circuit element that is electrically connected to the piezoelectric resonator;
a substrate holding member that is accommodated in the first sealed space and on which the piezoelectric resonator is mounted-the substrate holding member being supported by the base member at a predetermined distance from the base member;
a temperature sensor that is accommodated in the first sealed space and that is connected to a control circuit of the integrated circuit element, the temperature sensor sensing the temperature of the first sealed space; and
a heating element that is accommodated in the first sealed space and that heats the piezoelectric resonator in accordance with a command value that is calculated by the control circuit as a function of the temperature detected by the temperature sensor.

18. A piezoelectric oscillation device comprising:
the piezoelectric oscillator according to claim 4;
an integrated circuit element that is electrically connected to the piezoelectric resonator;
a substrate holding member that is accommodated in the first sealed space and on which the piezoelectric resonator is mounted-the substrate holding member being supported by the base member at a predetermined distance from the base member;
a temperature sensor that is accommodated in the first sealed space and that is connected to a control circuit of the integrated circuit element, the temperature sensor sensing the temperature of the first sealed space; and
a heating element that is accommodated in the first sealed space and that heats the piezoelectric resonator in accordance with a command value that is calculated by the control circuit as a function of the temperature detected by the temperature sensor.

19. The piezoelectric oscillator according to claim 1, wherein at least one of the first and second lid members has an inner surface that has a surface roughness Ra of 20 nm or less.

* * * * *